United States Patent [19]

Davis

[11] Patent Number: 4,677,593

[45] Date of Patent: Jun. 30, 1987

[54] LOW ACTIVE-POWER ADDRESS BUFFER

[75] Inventor: Harold L. Davis, The Colony, Tex.

[73] Assignee: Thomson Components-Mostek Corp., Carrollton, Tex.

[21] Appl. No.: 746,806

[22] Filed: Jun. 20, 1985

[51] Int. Cl.[4] .............................................. G11C 8/00
[52] U.S. Cl. ................................... 365/230; 365/229; 307/279
[58] Field of Search ............... 365/230, 233, 189, 229; 307/279

[56] References Cited

U.S. PATENT DOCUMENTS 4,195,238  3/1980  Sato ................................ 365/230 X Primary Examiner—Joseph A. Popek
Attorney, Agent, or Firm—Roland Plottel

[57] ABSTRACT

A buffer circuit accepting TTL input levels and generating logic-level signals incorporates means to reduce the power consumption in the circuit in the active phase as well as the inactive phase, without imposing additional restrictions on the user.

3 Claims, 3 Drawing Figures

LOW ACTIVE-POWER ADDRESS BUFFER

DESCRIPTION

1. Technical Field

The field of the invention is that of CMOS integrated circuits, in particular memory chips that have an input address buffer for storing an input address signal.

2. Background Art

It is well known in the art that the standard integrated circuit voltages are 0 and 5 volts for logic 0 and logic 1, respectively and that the standard TTL voltages are +0.8 and +2.4 volts.

It is necessary to have some sort of input adapter circuit to receive the TTL logic levels and produce standard integrated circuit logic levels. In the particular case of CMOS circuits, it is important that the circuit consume low power. A common method of adapting the logic levels is to have an input comparator circuit, having a high input impedance, that compares an on-chip voltage reference at 1.4 volts with the input and generates the corresponding integrated circuit logic level. A well known problem with this approach is that of providing a voltage reference circuit drawing no power and being insensitive to changes in the power supply voltage of the integrated circuit.

DISCLOSURE OF THE INVENTION

The invention relates to an input address buffer for an integrated circuit in which an input latch buffer element is preceded by a controlled gate which permits the establishment of a current path from an input/output pin to the latch for a fixed short time only.

A feature of the invention is the use of a gated input circuit that establishes a current path from the pin to the latch in response to a control signal and then cuts off that path as soon as the latch is prepared to fix the data.

Another feature of the invention is the use of a suitably proportioned NOR circuit to adapt the TTL level to the integrated circuit level.

BEST MODE OF CARRYING OUT THE INVENTION

It is well known in the field of CMOS circuit design that it is desirable to reduce the standby power consumption of the circuit. The art of designing CMOS circuits that consume relatively small amounts of power during the active period is less well developed.

Figure 1:
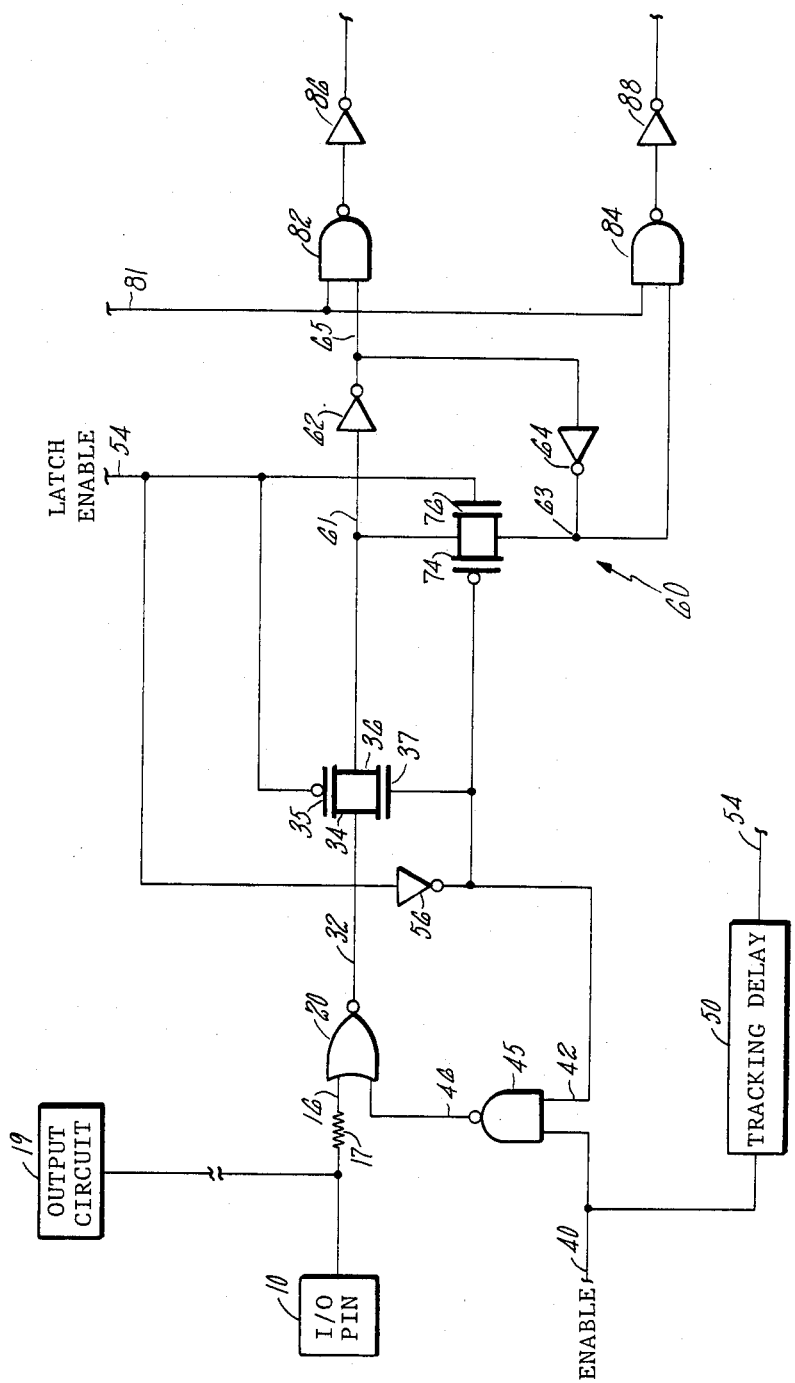
FIG. 1 illustrates a portion of an input address buffer according to the invention.

Referring now to FIG. 1, there is shown a portion of an input address buffer of a CMOS circuit constructed according to the invention. Input/output pin 10 is used both for the input of an address signal and also for transmitting the output stored data. It is therefore necessary for the system designer incorporating the integrated circuit memory of this invention to place an address signal on the pin for a time determined by the design parameters of the circuit and then to remove the signal before the output circuit places the data on the pin. If the system designer leaves the address signal on the pin for the entire length of time until the output data is ready, the input circuit will consume more power than is necessary, with the well known disadvantages of excess power consumption.

A logical "1" level of 2.4 volts or a logical "0" level of 0.8 volts on pin 10 raises or lowers node 16 accordingly, which is connected to pin 10 by resistor 17 and is the input to NOR circuit 20. Pin 10 also connects to output circuit 19 as shown. Resistor 17 is illustratively 50 squares of N+ diffusion having a resistivity of 20 ohms per square. Those skilled in the art will readily be able to modify the input resistance of this circuit to suit the particular requirements of the system at hand. NOR circuit 20 is shown in more detail in FIG. 2 below. Output node 32 of circuit 20 is connected to a CMOS pair of pass transistors 34 and 36 having gate nodes 35 and 37 respectively. P-channel gate node 35 is connected to latch enable node 54 which is a signal from another portion of the integrated circuit to enable the latch and cause it to hold the voltage level present on node 61, the output of the pass transistor pair. Transistors 74 and 76 form a corresponding pass transistor pair that is the inverse of the isolation pair of transistors 34 and 36. The latch enable signal on latch enable node 54 controls one of each set of pass transistors. The signal is inverted in inverter 56 and passes to node 37 controlling the other half of the pass transistors. The first pair, 34 and 36, serves to isolate the latch from NOR circuit 20, while the second pair, 74 and 76, serves to latch and hold the data from NOR circuit 20. Latch 60 is a conventional latch consisting of cross-coupled inverters 62 and 64 having an input node 61 and output nodes 63 and 65.

Figure 3:
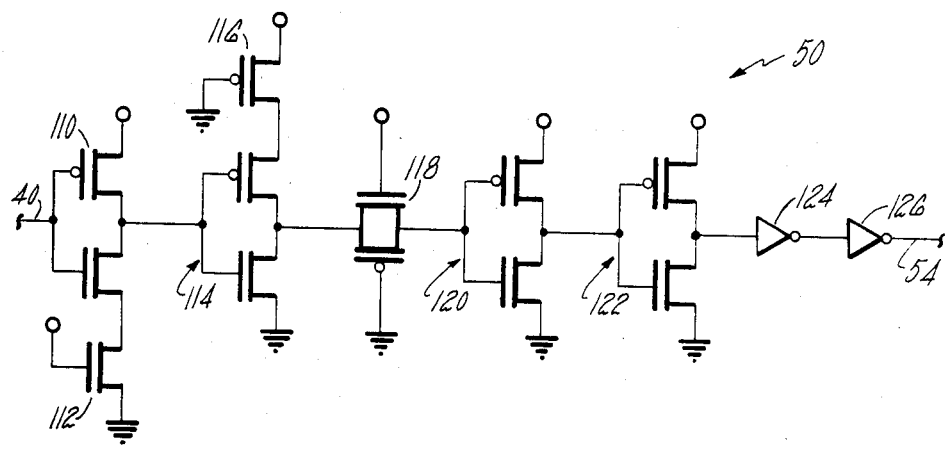
FIG. 3 illustrates the tracking delay circuit used in FIG. 1.

The same inverted latch enable signal that stores the data on node 61 is also input on line 42 to NAND gate 45. Line 46, the output of NAND gate 45, is the other input to NOR circuit 20. The other input to NAND gate 45 is node 40 which is a load signal from a chip enable gate indicating that valid data is present on input-/output pin 10 and the device is ready to accept input data. Node 46 is normally high, forcing the output node 32 of NOR gate 20 to be low independent of the voltage on pin 10. No current is drawn when node 46 is high. During the time when the device is ready to accept input data, a current path through NOR gate 20 is desired, and node 46 will be low in response to the signal on node 40, causing NOR gate 20 to be enabled. Now, when the data on pin 10 is high the output node 32 will be low and vice versa. The signal on node 40 has also enabled the tracking delay circuit 50 (shown in more detail in FIG. 3). This circuit puts the latch enable signal on node 54 at a time just after the signal on input pin 10 can propagate through the NOR gate 20 and latch circuit 60 and onto node 63. As can be seen in FIG. 3, delay circuit 50 is constructed to match the transit time of the circuits in the chain from nodes 16 to node 63. Inverter 110 and pull-down transistor 112 simulate the timing of NAND gate 45. Likewise, inverter 114 and pull-up transistor 116 simulate the timing of NOR gate 20. Pass transistor pair 118 and inverters 120 and 122 simulate the remaining circuits in the path to node 63. Inverters 124 and 126 are added to provide a margin of delay. The circuit similarities between the tracking circuit and the buffer allow excellent tracking.

When latch enable node 54 is low, the signal on node 32 passes through isolation transistor pair 34 and 36 to node 61. The same signal on enable node 54 disconnects the current path between node 63 and node 61 so that the feedback action of latch 60 is not present and node 61 is readily forced to the voltage on node 32. When latch enable signal 54 changes state in response to the tracking delay input 40, going from normally low to high, latch 60 becomes effective as a current path is created through transistors 74 and 76, while the path between nodes 32 and 61 is disconnected. Latch 60 thus stores the voltage that was present on node 61. After the signal on node 54 has propagated through inverter 56 and NAND gate 45, it causes NOR gate 20 to become effectively disabled, as will be discussed below. This disabling of NOR gate 20 is the mechanism by which the power consumption during the active period is reduced. If NOR gate 20 were left active, it would consume power as long as there is a logic "0" signal of 0.8 volts on node 16. Once latch 60 has stabilized and is ready to store the data, there is no further need for the presence of the signal on node 16, or the activation of NOR circuit 20, and any power consumed after that time is wasted.

It would be unreasonable to impose upon the system designer a constraint to terminate the signal on pin 10 after a short period of time and such a constraint might inhibit the sales of the integrated circuit. The preferred method, therefore, is to permit the system designer to let the signal remain on pin 10 up to the time when output circuit 19 is ready to release data to the pin. Thus, the maximum degree of flexibility has been left to the system designer.

The output node 65 of latch 60 and the complement output node 63, containing the inverse data, are connected to NAND gates 82 and 84, respectively, which NAND gates are controlled by an enable signal on wire 81. This enable signal will come from conventional circuitry within the integrated circuit and is used to permit the passage of the stored data when the rest of the circuit is prepared to receive it. Those skilled in the art will recognize that such gating is optional and may be modified to suit any particular circuit. Similarly, inverters 86 and 88 are optional and are used to provide a suitable power level to drive the circuits connected to the address buffer and also to provide the desired output polarities.

In the embodiment disclosed in FIG. 1, the latch enable signal on node 54 is self-timed in that it is the delayed signal that is used to indicate that valid data is present on the output/input pin 10. The signal on node 40 passes through the tracking delay circuit 50 (shown in FIG. 3) and is selected to allow NOR circuit 20 to settle so that valid data will pass through NOR circuit 20 and latch circuit 60 and the correct data will be at node 63 ready to be latched.

Figure 2:
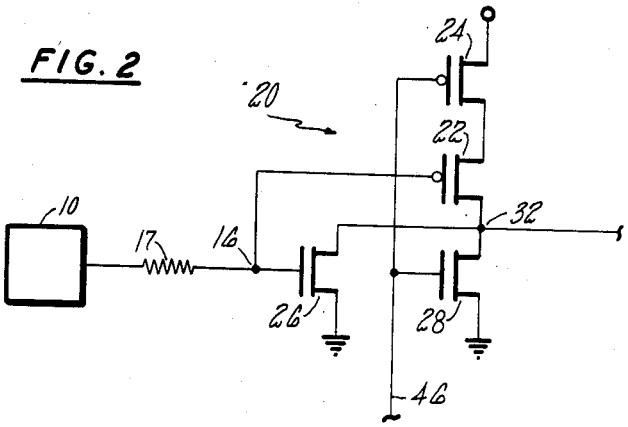
FIG. 2 illustrates a NOR circuit used in FIG. 1.

Referring now to FIG. 2, there is shown an embodiment of NOR circuit 20, in which input node 16 is connected to the gate of N-channel transistor 26 and P-channel transistor 22 that, together with N-channel transistor 28 and P-channel transistor 24, form a conventional NOR gate. Transistors 28 and 24 are controlled by node 46. Node 46 will be low during the period of time when circuit 20 is to be active. When the data on pin 10 is 0 volts, there is no problem of power consumption because transistor 28 will be turned off by the zero voltage on node 46 and transistor 26 will be turned off by the 0 volts on node 16, so that there is no current path to ground through circuit 20. However, a voltage input of 0.8 volts must still be accepted as a logic "0" input, and the desire for low power remains. With an input of 0.8 volts, transistor 26 and transistor 22 will both be turned on. There is thus a path from VCC through the partially turned on transistor 22 and the fully turned on transistor 24 to output node 32 and then through the partially turned on transistor 26 to ground. Current will flow through this node as long as the voltage remains on pin 10. The voltage on node 32 in this case will be set by the relative impedances of transistors 22 and 24 above the node and transistor 26 below it. It is necessary that this voltage be within the allowed band for a logic "1" output at node 32 and on into latch 60 of course. Those skilled in the art will readily be able to calculate the appropriate size transistors of the set of 22, 24 and 26 to ensure that this is the case. The actual transistor sizing will depend of the transconductance of the transistors which, in turn, depends on the details of the process being employed. Those skilled in the art will readily be able to adjust for different process variations. In a particular embodiment, the relative magnitudes of the transistors are 1, 2, and 3 for transistors 22, 24, and 26 respectively. When the inverted latch enable signal from node 54 reaches NAND gate 45, node 46 switches states from low to high, cutting off the current path by turning off transistor 24. Therefore, active power is consumed only during the time required for the input signal to propagate through latch circuit 60, then the current path is disconnected and no more power is drawn.

In a particular embodiment, the current drain through the 3 transistor path is a nominal 2 milliamperes. In this embodiment also, there are 18 pins that have such a buffer, so the total power current consumption during the active period is 36 milliamperes. The reduction of this current consumption from a nominal time period of 100 nanoseconds, but which can be an indefinite period of time, down to a shortened period of 5 nanoseconds results in a substantial reduction in the average power consumed by the circuit during operation.

What is claimed is:

1. An input buffer circuit for low-power operation comprising:
   controlled isolation means having a first input terminal for receiving a data signal, a second input terminal for receiving a first control signal and an isolation output terminal, and further having an active power-drawing state and a normal inactive state;
   latch means having an input terminal, an output terminal, and a control terminal, the input terminal being supplied by the voltage on said isolation output terminal, the output terminal storing the voltage level on said isolation output terminal, and the control terminal being supplied by a second control signal from a latch enable node supplied by the first control signal after a predetermined delay;
   time control means having a time control output connected to said second input terminal, and having an enabling input terminal for receiving an enabling signal and a timing terminal for receiving a disabling signal, for controlling the duration of said first control signal; and
   delay means having a delay input terminal connected to said enabling input terminal and a delay output terminal connected to said latch enable node, for enabling said latch a predetermined time after a signal is received on said enabling input terminal;
   so that, in operation, said controlled isolation means switches to said active power-drawing state in response to an enabling signal for a time duration determined by said delay means, that is not controlled by the duration of said data signal.

2. An input buffer circuit according to claim 1, in which said controlled isolation means includes a path from a power supply node to ground through at least one transistor controlled by said time control means and through at least two transistors controlled by said data signal, the relative impedances of said transistors on said path being selected so that a pull-down transistor connected between ground and said isolation output terminal and being controlled by said time control means will maintain the voltage on the isolation output terminal within the range corresponding to a logic 1 signal when said transistors connected in series between said isolation output node and said power supply node and being controlled by said data signal means are each conductive.

3. A buffer circuit comprising an NOR circuit, having a pair of input terminals, one of which is connected to an input data signal terminal, and an output terminal, a NAND circuit having a pair of input terminals, one of which is connected to an enabling input terminal, and an output terminal which is connected to the other input terminal of the NOR circuit, a delay means which includes an output terminal and an input terminal which is connected to said enabling input terminal, first and second complementary pass transistor pairs, the first pair having an input terminal connected to the output terminal of the NOR circuit, an output terminal, and a pair of control terminals, one of which is connected to the output terminal of the delay means, and the other to the output terminal of an inverter whose input terminal is connected to the output terminal of the delay means and to the other terminal of said NAND circuit, the second pair having an input terminal connected to the output terminal of the first pair, an output terminal, and a pair of control terminals, one of which is connected to the output terminal of the delay means and the other of which is connected to the output terminal of said inverter, and latch means comprising a pair of cross coupled inverters, the input terminal of the first inverter being connected to the output terminal of the first complementary pass transistor pair and the output terminal of which is connected to the input terminal of the second inverter, the output terminal of which is connected to the other control terminal of the second complementary pass transistor pair.

* * * * *